US007813559B2

(12) United States Patent
Duquette et al.

(10) Patent No.: US 7,813,559 B2
(45) Date of Patent: Oct. 12, 2010

(54) IMAGE ANALYSIS FOR PICK AND PLACE MACHINES WITH IN SITU COMPONENT PLACEMENT INSPECTION

(75) Inventors: David W. Duquette, Minneapolis, MN (US); Eric P. Rudd, Hopkins, MN (US); Thomas W. Bushman, Marblehead, MA (US); Swaminathan Manickam, Wilmington, MA (US); Timothy A. Skunes, Mahtomedi, MN (US); Steven K. Case, St. Louis Park, MN (US)

(73) Assignee: CyberOptics Corporation, Golden Valley, MN (US)

( * ) Notice: Subject to any disclaimer, the term of this patent is extended or adjusted under 35 U.S.C. 154(b) by 1106 days.

(21) Appl. No.: 11/131,926

(22) Filed: May 18, 2005

(65) Prior Publication Data

US 2005/0276464 A1 Dec. 15, 2005

Related U.S. Application Data

(63) Continuation-in-part of application No. 10/291,074, filed on Nov. 8, 2002, now Pat. No. 7,239,399.

(60) Provisional application No. 60/572,067, filed on May 18, 2004, provisional application No. 60/338,233, filed on Nov. 13, 2001, provisional application No. 60/356,801, filed on Feb. 13, 2002, provisional application No. 60/374,964, filed on Apr. 22, 2002.

(51) Int. Cl.
*G06K 9/68* (2006.01)
(52) U.S. Cl. .......................... 382/219; 382/151; 382/153
(58) Field of Classification Search .............. 318/568.1, 318/577, 565, 569, 570, 571, 578, 579, 580; 29/833, 832, 407.04, 720, 740, 834; 356/399, 356/375, 255, 400; 382/219, 147
See application file for complete search history.

(56) References Cited

U.S. PATENT DOCUMENTS 3,814,845 A 6/1974 Hurlbrink, III et al. ....... 178/6.8

(Continued)

FOREIGN PATENT DOCUMENTS

CN 1317926 10/2001

(Continued)

OTHER PUBLICATIONS

The International Search Report and Written Opinion from Appln No. PCT/US/2006/019281, filed May 18, 2006.

(Continued)

*Primary Examiner*—Brian Q Le
*Assistant Examiner*—Mekonen Bekele
(74) *Attorney, Agent, or Firm*—Christopher R. Christensen; Westman, Champlin & Kelly, P.A.

(57) ABSTRACT

The present invention includes a method of determining a location of a component on a workpiece. A before-placement standard image is acquired of an intended placement location on a standard workpiece. Then, a standard component is placed upon the standard workpiece and the placement is verified. An after-placement standard image is acquired and a standard difference image is created from the before and after standard images. Then, a before-placement test image is acquired of an intended placement location on the workpiece. A component is then placed upon the workpiece, and after-placement test image is acquired. A test difference image is created from the before and after test images. A first offset is calculated between the before standard difference image and the before test image. Then, the test difference is transformed based on the first offset to generate a difference test image (DTR) that is registered to the standard difference image. The standard difference image is correlated to the registered difference test image (DTR) to generate a registration offset indicative of placement efficacy.

20 Claims, 13 Drawing Sheets

U.S. PATENT DOCUMENTS

| | | | |
|---|---|---|---|
| 4,281,342 A | 7/1981 | Ueda et al. | 348/94 |
| 4,589,140 A | 5/1986 | Bishop et al. | 382/8 |
| 4,776,088 A | 10/1988 | Biggs et al. | 29/834 |
| 4,805,111 A | 2/1989 | Steidel | 364/469 |
| 4,809,430 A | 3/1989 | Maruyama et al. | 29/834 |
| 4,825,091 A | 4/1989 | Breyer et al. | 250/559.38 |
| 4,914,513 A | 4/1990 | Spigarelli et al. | 358/101 |
| 4,978,224 A * | 12/1990 | Kishimoto et al. | 356/394 |
| 4,989,082 A * | 1/1991 | Hopkins | 382/151 |
| 4,999,785 A | 3/1991 | Schmuter | 364/507 |
| 5,003,692 A * | 4/1991 | Izumi et al. | 29/834 |
| 5,023,916 A | 6/1991 | Breu | 382/8 |
| 5,060,366 A | 10/1991 | Asai et al. | 29/739 |
| 5,086,559 A | 2/1992 | Akatsuchi | 29/834 |
| 5,105,149 A | 4/1992 | Tokura | 324/158 |
| 5,127,061 A | 6/1992 | Amir et al. | 382/1 |
| 5,129,725 A | 7/1992 | Ishizuka et al. | 356/617 |
| 5,134,665 A | 7/1992 | Jyoko | 382/8 |
| 5,194,791 A * | 3/1993 | Cull | 318/568.1 |
| 5,235,316 A | 8/1993 | Qualizza | 340/436 |
| 5,237,622 A * | 8/1993 | Howell | 382/151 |
| 5,249,349 A | 10/1993 | Kuinose et al. | 29/721 |
| 5,278,634 A | 1/1994 | Skunes | 356/400 |
| 5,298,977 A | 3/1994 | Shintani et al. | 356/376 |
| 5,336,935 A | 8/1994 | Shitanda et al. | 307/116 |
| 5,377,405 A | 1/1995 | Sakurai et al. | 29/833 |
| 5,383,270 A | 1/1995 | Iwatsuka et al. | 29/840 |
| 5,384,956 A | 1/1995 | Sakurai et al. | 29/834 |
| 5,392,360 A * | 2/1995 | Weindelmayer et al. | 382/151 |
| 5,450,204 A | 9/1995 | Shigeyama et al. | 356/604 |
| 5,461,480 A | 10/1995 | Yamada et al. | 256/394 |
| 5,467,186 A * | 11/1995 | Indo et al. | 356/150 |
| 5,471,310 A * | 11/1995 | Spigarelli et al. | 356/399 |
| 5,495,424 A | 2/1996 | Tokura | 364/507 |
| 5,537,204 A | 7/1996 | Woodhouse | 356/243 |
| 5,541,834 A * | 7/1996 | Tomigashi et al. | 700/59 |
| 5,550,583 A | 8/1996 | Amir et al. | 348/126 |
| 5,566,447 A | 10/1996 | Sakurai | 294/832 |
| 5,589,942 A | 12/1996 | Gordon | 356/611 |
| 5,598,345 A | 1/1997 | Takura | 364/489 |
| 5,619,328 A | 4/1997 | Sakurai | 356/375 |
| 5,627,913 A | 5/1997 | Spigarelli et al. | 382/151 |
| 5,660,519 A | 8/1997 | Ohta et al. | 414/783 |
| 5,686,994 A * | 11/1997 | Tokura | 356/394 |
| 5,719,952 A | 2/1998 | Rooks | 382/150 |
| 5,724,722 A | 3/1998 | Hashimoto | 29/740 |
| 5,739,846 A | 4/1998 | Gieskes | 348/87 |
| 5,745,241 A | 4/1998 | Hashimoto | 356/384 |
| 5,749,142 A | 5/1998 | Hanamura | 29/833 |
| 5,754,677 A | 5/1998 | Kawada | 382/141 |
| 5,835,133 A | 11/1998 | Moreton et al. | 348/49 |
| 5,839,186 A | 11/1998 | Onodera | 29/720 |
| 5,878,151 A | 3/1999 | Tang et al. | 382/103 |
| 5,900,940 A | 5/1999 | Aoshima | 356/375 |
| 5,903,353 A * | 5/1999 | Raymond | 356/620 |
| 5,908,282 A | 6/1999 | Onodera | 414/783 |
| 5,911,001 A | 6/1999 | Kawada | 382/141 |
| 5,912,984 A * | 6/1999 | Michael et al. | 382/149 |
| 5,949,681 A | 9/1999 | Asai et al. | 700/113 |
| 5,956,149 A | 9/1999 | Suzuki et al. | 356/375 |
| 5,969,820 A | 10/1999 | Yoshii et al. | 356/375 |
| 5,982,927 A | 11/1999 | Koljonen | 382/168 |
| 6,027,019 A | 2/2000 | Kou | 235/375 |
| 6,047,084 A * | 4/2000 | Kent et al. | 382/147 |
| 6,079,098 A | 6/2000 | Soellner et al. | 29/832 |
| 6,167,607 B1 * | 1/2001 | Pryor | 29/407.04 |
| 6,195,165 B1 | 2/2001 | Sayegh | 356/376 |
| 6,198,529 B1 | 3/2001 | Clark et al. | 356/237.5 |
| 6,223,425 B1 | 5/2001 | Asai et al. | 29/740 |
| 6,240,633 B1 | 6/2001 | Kent et al. | 29/832 |
| 6,286,202 B1 * | 9/2001 | Asai et al. | 29/740 |
| 6,317,972 B1 * | 11/2001 | Asai et al. | 29/833 |
| 6,332,536 B2 | 12/2001 | Easton | 206/459.5 |
| 6,334,840 B1 | 1/2002 | Asai et al. | 483/1 |
| 6,404,847 B1 | 6/2002 | Ueki et al. | 378/45 |
| 6,408,090 B1 | 6/2002 | Salomon et al. | 382/145 |
| 6,478,533 B2 | 11/2002 | Davis, III | 414/816 |
| 6,506,614 B1 * | 1/2003 | Strassmann | 438/7 |
| 6,522,777 B1 | 2/2003 | Paulsen et al. | 382/154 |
| 6,538,244 B1 | 3/2003 | Skunes | 250/208.1 |
| 6,538,750 B1 | 3/2003 | Fishbaine et al. | 356/614 |
| 6,549,647 B1 | 4/2003 | Skunes et al. | 382/150 |
| 6,583,884 B2 | 6/2003 | Rudd et al. | 356/601 |
| 6,608,320 B1 | 8/2003 | Skunes et al. | 250/559.19 |
| 6,616,263 B2 | 9/2003 | Allen et al. | 347/19 |
| 6,622,054 B1 | 9/2003 | Okuda et al. | 700/51 |
| 6,681,151 B1 | 1/2004 | Weinzimmer et al. | 700/259 |
| 6,718,626 B2 | 4/2004 | Kawada | 29/740 |
| 6,738,505 B1 | 5/2004 | Prince | 382/150 |
| 6,744,499 B2 | 6/2004 | Skunes et al. | 356/243.1 |
| 6,748,649 B2 | 6/2004 | Okuda et al. | 29/740 |
| 6,762,847 B2 | 7/2004 | Duquette et al. | 356/614 |
| 6,778,878 B1 | 8/2004 | Kou | 700/221 |
| 6,801,652 B1 | 10/2004 | Stanzl et al. | 382/147 |
| 6,807,725 B2 | 10/2004 | Asai et al. | 29/740 |
| 6,891,967 B2 | 5/2005 | Prince | 382/150 |
| 6,966,235 B1 | 11/2005 | Paton | 73/865.9 |
| 6,987,530 B2 | 1/2006 | McConica | 348/208.6 |
| 7,029,224 B2 | 4/2006 | Kubo et al. | 414/680 |
| 7,043,824 B2 * | 5/2006 | Suhara et al. | 29/740 |
| 7,083,082 B2 | 8/2006 | Byskov et al. | 235/375 |
| 7,239,399 B2 | 7/2007 | Duquette et al. | 356/614 |
| 2001/0033386 A1 | 10/2001 | Kranz et al. | 356/601 |
| 2001/0040117 A1 | 11/2001 | Easton | 206/714 |
| 2002/0014003 A1 | 2/2002 | Asai et al. | 29/740 |
| 2002/0031279 A1 | 3/2002 | Shimizu | 382/291 |
| 2002/0053133 A1 | 5/2002 | Suhara et al. | 29/700 |
| 2002/0069395 A1 | 6/2002 | Fujiwara et al. | 716/4 |
| 2002/0078580 A1 | 6/2002 | Haugen et al. | 33/533 |
| 2002/0099466 A1 | 7/2002 | Diggin et al. | 700/121 |
| 2002/0112064 A1 | 8/2002 | Eastvold | 709/230 |
| 2002/0124391 A1 | 9/2002 | Kawai et al. | 29/739 |
| 2002/0133940 A1 | 9/2002 | Kadomatsu et al. | 29/832 |
| 2002/0143423 A1 | 10/2002 | Huber et al. | 700/121 |
| 2003/0027363 A1 | 2/2003 | Kodama | 438/14 |
| 2003/0029033 A1 | 2/2003 | Hidese et al. | 29/833 |
| 2003/0098426 A1 | 5/2003 | Hayata | 250/559.34 |
| 2003/0110610 A1 | 6/2003 | Duquette et al. | 29/407.09 |
| 2003/0111494 A1 | 6/2003 | Lin et al. | 356/614 |
| 2003/0125895 A1 | 7/2003 | Kawai et al. | 702/117 |
| 2003/0159515 A1 | 8/2003 | Tonomura | 73/584 |
| 2003/0219330 A1 | 11/2003 | Lyndaker et al. | 414/411 |
| 2003/0225547 A1 | 12/2003 | Paradies | 702/150 |
| 2004/0094594 A1 | 5/2004 | Liebeke | 226/32 |
| 2004/0119987 A1 | 6/2004 | Madsen et al. | 356/614 |
| 2004/0135884 A1 | 7/2004 | Saeki | 348/86 |
| 2004/0163243 A1 | 8/2004 | Noda et al. | 29/834 |
| 2004/0184653 A1 | 9/2004 | Baer et al. | 382/145 |
| 2004/0186616 A1 | 9/2004 | Overman et al. | 700/224 |
| 2005/0077340 A1 | 4/2005 | Nagafuku et al. | 228/8 |
| 2005/0097035 A1 | 5/2005 | Likas et al. | 705/39 |
| 2005/0115060 A1 | 6/2005 | Kondo | 29/650 |
| 2005/0117797 A1 | 6/2005 | Gaida | 382/153 |
| 2005/0123187 A1 | 6/2005 | Bushman et al. | 382/141 |
| 2005/0125993 A1 | 6/2005 | Madsen et al. | 29/739 |
| 2005/0137979 A1 | 6/2005 | Rekeweg et al. | 705/42 |
| 2005/0161498 A1 | 7/2005 | Byskov et al. | 235/376 |
| 2005/0210832 A1 | 9/2005 | Tassin et al. | 53/396 |
| 2005/0235913 A1 | 10/2005 | Prentice et al. | 118/712 |
| 2005/0268460 A1 | 12/2005 | Case | 29/833 |
| 2005/0276464 A1 | 12/2005 | Duquette et al. | 382/151 |
| 2006/0016066 A1 | 1/2006 | Gaida et al. | 29/740 |
| 2006/0075631 A1 * | 4/2006 | Case et al. | 29/709 |
| 2006/0174480 A1 | 8/2006 | Kawada | 29/833 |

| | | | | |
|---|---|---|---|---|
| 2007/0003126 A1 | 1/2007 | Case et al. ............ 382/141 | WO | WO 99/49713 | 9/1999 |
| 2007/0010969 A1 | 1/2007 | Madsen et al. .......... 702/183 | WO | WO 00/19794 | 4/2000 |

FOREIGN PATENT DOCUMENTS

| | | |
|---|---|---|
| CN | 1438836 | 8/2003 |
| DE | 19801978 | 7/1999 |
| EP | 0 664 666 B1 | 8/1997 |
| EP | 0 932 331 A1 | 7/1999 |
| EP | 0 948 250 | 10/1999 |
| EP | 0 959 654 | 11/1999 |
| EP | 1014438 | 12/1999 |
| EP | 1 152 604 | 11/2001 |
| EP | 1 343 363 | 9/2003 |
| GB | 2 317 496 | 3/1998 |
| JP | 62298750 | 12/1987 |
| JP | 63090707 | 4/1988 |
| JP | 63275200 | 11/1988 |
| JP | 01309190 | 12/1988 |
| JP | 02076080 | 3/1990 |
| JP | 02235399 | 9/1990 |
| JP | 04031974 | 2/1992 |
| JP | 05251897 | 9/1993 |
| JP | 06053694 | 2/1994 |
| JP | 06201532 | 7/1994 |
| JP | 5-37918 | 9/1994 |
| JP | 6-249629 | 9/1994 |
| JP | 6-249630 | 9/1994 |
| JP | 6-310899 | 11/1994 |
| JP | 07037063 | 2/1995 |
| JP | 07183697 | 7/1995 |
| JP | 7-77319 | 8/1995 |
| JP | 7-336099 | 12/1995 |
| JP | 8032291 | 2/1996 |
| JP | 8-111598 | 4/1996 |
| JP | 9-021609 | 1/1997 |
| JP | 9-023097 | 1/1997 |
| JP | 09193515 | 7/1997 |
| JP | 9-205299 | 8/1997 |
| JP | 9-210626 | 8/1997 |
| JP | 9-214198 | 8/1997 |
| JP | 9-223898 | 8/1997 |
| JP | 9-246799 | 9/1997 |
| JP | 10136962 | 5/1998 |
| JP | 11168300 | 6/1999 |
| JP | 9-293998 | 9/1999 |
| JP | 11285925 | 10/1999 |
| JP | 2000-022392 | 1/2000 |
| JP | 2000-114692 | 4/2000 |
| JP | 2000339456 | 12/2000 |
| JP | 2000349499 (A) | 12/2000 |
| JP | 2003152392 | 5/2001 |
| JP | 2001-165860 | 6/2001 |
| JP | 2001-168600 | 6/2001 |
| JP | 2001168594 | 6/2001 |
| JP | 2001177836 | 6/2001 |
| JP | 2003-243898 | 2/2002 |
| JP | 2003243899 | 8/2002 |
| JP | 2002271099 | 9/2002 |
| JP | 20038295 | 1/2003 |
| JP | 2003-504746 | 2/2003 |
| JP | 2003-092495 | 3/2003 |
| JP | 2003-304095 | 10/2003 |
| JP | 2005285840 | 3/2004 |
| WO | 96/22673 | 7/1996 |
| WO | WO 98/24293 | 6/1998 |
| WO | 98/41078 | 9/1998 |
| WO | WO 99/49713 | 9/1999 |
| WO | WO 00/19794 | 4/2000 |
| WO | WO 00/19800 | 4/2000 |
| WO | WO 00/26640 | 5/2000 |
| WO | WO 00/38494 | 6/2000 |
| WO | WO 01/67831 A2 | 9/2001 |
| WO | WO 02/46713 | 6/2002 |
| WO | WO 02/29357 | 5/2003 |
| WO | WO 03/043400 A1 | 5/2003 |
| WO | WO 2005/115073 | 12/2005 |
| WO | WO 2006/125102 | 11/2006 |

OTHER PUBLICATIONS

First Office Action from Chinese patent application No. 200580033036.9, filed Oct. 5, 2005.
Machine translation of JP 06201532.
International Search Report and Written Opinion for application No. PCT/US2006/035954, dated Jan. 31, 2007.
International Search Report and Written Opinion for application No. PCT/US2006/042337, dated Mar. 8, 2007.
International Search Report and Written Opinion for application No. PCT/US2007/011819, dated Jan. 16, 2008.
Official Action for Japanese patent application No. 2006-539579, mailed Jul. 28, 2009.
Official Action for Japanese patent application No. 2006-539635, mailed Jul. 28, 2009.
Notice of Preliminary Rejection for Korean patent application No. 10-2004-7007281, dated Jul. 30, 2009.
First Rejection Notice for Japanese patent application No. 2003-545092, dated Jan. 23, 2008.
Second Rejection Notice for Japanese patent application No. 2003-545092, dated May 21, 2008.
Official Action from German patent application No. 102 97 444.6, dated Nov. 16, 2009.
Official Action from Japanese patent application No. 2006-538473, dated Nov. 10, 2009.
The International Preliminary Report on Patentability for foreign application No. PCT/US2004/036238 filed Oct. 29, 2004; Notification of Transmittal of The International Search Report and Written Opinion of the International Searching Authority for application No. PCT/US2004/036238, filed Oct. 29, 2004.
Chinese Office Action from Application No.: 02826679.X, filed Nov. 12, 2002.
International Search Report and Written Opinion from application No.: PCT/US05/017425, filed May 18, 2005; Notification of Transmittal of the International Preliminary Report from application No.: PCT/US05/017425, filed May 18, 2005.
International Search Report from Appln No.: PCT/US2004/036683, filed Nov. 3, 2004; International Preliminary Report on Patentability from Application No.: PCT/US2004/036683, filed Nov. 3, 2004.
The Notification of Transmittal of International Preliminary Examination Report in foreign application No. 2005/025905, filed Jul. 21, 2005; International Search Report and Written Opinion from foreign application No. 2005/025905, filed Jul. 21, 2005.
The International Search Report from Appln No. PCT/US/2002/36154, filed Nov. 11, 2002.
The International Preliminary Report on Patentability in foreign Appln No. PCT/US/2004/036704, filed Nov. 3, 2004; Notification of Transmitttal of the International Search Report and Written Opinion of the International Searching Authority in foreign Appln No. PCT/US/2004/036704, filed Nov. 3, 2004.
The International Preliminary Report on Patentability from Appln No. PCT/US/2005/35985, filed Oct. 5, 2005; International Search Report and Written Opinion from Appln No. PCT/US/2005/35985, filed Oct. 5, 2005.

* cited by examiner

IMAGE ANALYSIS FOR PICK AND PLACE MACHINES WITH IN SITU COMPONENT PLACEMENT INSPECTION

CROSS REFERENCE TO RELATED APPLICATIONS

This application claims priority to U.S. provisional patent application Ser. No. 60/572,067, filed May 18, 2004 entitled COMPONENT REGISTRATION MEASUREMENT; and this application is a Continuation-In-Part application of U.S. patent application Ser. No. 10/291,074, filed Nov. 8, 2002 now U.S. Pat. No. 7,239,399, entitled Pick and Place Machine with Component Placement Inspection, which application claims priority to the following prior provisional applications: Ser. No. 60/338,233 filed Nov. 13, 2001 entitled INSPECTION METHODS FOR A PICK AND PLACE MACHINE; Ser. No. 60/356,801 filed Feb. 13, 2002 entitled PICK AND PLACE MACHINE WITH COMPONENT PLACEMENT INSPECTION; and Ser. No. 60/374,964 filed Apr. 22, 2002 entitled IMPROVED INSPECTION. Each and every provisional application listed above is incorporated by reference herein in its entirety.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

Pick and place machines are generally used to manufacture electronic circuit boards. A blank printed circuit board is usually supplied to the pick and place machine, which then picks electronic components from component feeders, and places such components upon the board. The components are held upon the board temporarily by solder paste, or adhesive until a subsequent step in which the solder paste is melted, or the adhesive is fully cured.

Pick and place machine operation is challenging. Since machine speed corresponds with throughput, the faster the pick and place machine runs, the less costly the manufactured board. Additionally, placement accuracy is extremely important. Many electrical components, such as chip capacitors and chip resistors are relatively small and must be accurately placed on equally small placement locations. Other components, while larger, have a significant number of leads or conductors that are spaced from one another at a relatively fine pitch. Such components must also be accurately placed to ensure that each lead is placed upon the proper pad. Thus, not only must the machine operate extremely fast, but it must also place components extremely accurately.

In order to enhance the quality of board manufacture, fully or partially populated boards are generally inspected after the placement operation(s), both before and after solder reflow, in order to identify components that are improperly placed or missing or any of a variety of errors that may occur. Automatic systems that perform such operation(s) are highly useful in that they help identify component placement problems prior to solder reflow allowing substantially easier rework or identify defective boards after reflow that are candidates for rework. One example of such a system is sold under the trade designation Model KS 200 available from CyberOptics Corporation of Golden Valley, Minn. This system can be used to identify such problems as alignment and rotation errors; missing and flipped components; billboards; tombstones; component defects; incorrect polarity; and wrong components. Identification of errors pre-reflow provides a number of advantages. Rework is easier; closed-loop manufacturing control is facilitated; and less work in-process exists between error generation and remedy. While such systems provide highly useful inspection, they do consume plant floor-space as well as programming time maintenance efforts and the like.

One relatively recent attempt to provide the benefits of after-placement inspection located within a pick a place machine itself is disclosed in U.S. Pat. No. 6,317,972 to Asai et al. That reference reports a method for mounting electric components where an image of a mounting location is obtained prior to component placement, and compared with an image of the mounting location after component placement to inspect the placement operation at the component level.

While the disclosure of Asai et al. marks one attempt to employ in-machine component level inspection, there remains much work to be done. For example, the disclosure of Asai et al. is primarily related to turret-style pick and place machines, where the placement position does not move in the x and y directions, but simply moves up and down. In such systems, relatively large and heavy imaging systems can be provided proximate the nozzle(s), image a plurality of placement events and still have little, or no, adverse impact on placement machine speed or design layout. In contrast, on gantry-style pick and place machines (given relatively little attention by Asai et al.) the nozzle moves in at least one of the x and y directions. Thus, optics intended to image a plurality of placement events also move in x and/or y. Accordingly, the size and mass (inertial load) of the optical system itself can be prohibitive of on-head use in gantry-style machines. Further, since the head of a gantry-style pick and place machine is moving in x and/or y, it is important to minimize the size of the optical system to reduce the possibility that it will collide with other portions of the pick and place machine.

For pick and place machines having heads that move in x and/or y, increased mass is an issue because of the increased inertia. Achieving a certain machine throughput is dependent, in part, on the head's acceleration. Given a certain motive power provided by the electromechanical system of the pick and place machine, increased mass causes decreased acceleration.

Size, that is volume and/or shape of the optical system attached to the moving head, can also be a problem for a number of reasons. One reason is that the head may be designed so as to just fit in its environment as it moves about its workspace without colliding with anything. Adding something that protrudes beyond the spatial envelope of the existing head structure must be done with care and consideration of the possibility of physical conflict. Another reason that the size and/or shape of the head can become a problem is that there are generally a relatively large number of cables, tubes, motors, and other structures mounted to the head. Adding something that may conflict with assembly or maintenance of the machine is generally disfavored.

Given the relatively high speed at which component placement occurs, the acquisition of before and after images must take place in relatively fleeting instants. For example, the before-placement image is recorded immediately (typically a few milliseconds) prior to placement; and the after-placement image is also recorded immediately (typically a few milliseconds) after placement. The timing of these image acquisitions is intended to minimize the effects of any system motion during the placement operations. However, real-world limitations on the physical system will always introduce, at least to some extent, relative motion occurring between acquisition of the before-placement image and that of the after-placement image. Providing improved image analytics to address, characterize and ameliorate these movements will facilitate higher-speed operation with better accuracy.

SUMMARY OF THE INVENTION

The present invention includes a method of determining a location of a component on a workpiece. A before-placement standard image is acquired of an intended placement location on a standard workpiece. Then, a standard component is placed upon the standard workpiece and the placement is verified. An after-placement standard image is acquired and a standard difference image is created from the before and after standard images. Then, a before-placement test image is acquired of an intended placement location on the workpiece. A component is then placed upon the workpiece, and after-placement test image is acquired. A test difference image is created from the before and after test images. A first offset is calculated between the before standard difference image and the before test image. Then, the test difference is transformed based on the first offset to generate a difference test image (DTR) that is registered to the standard difference image. The standard difference image is correlated to the registered difference test image (DTR) to generate a registration offset indicative of placement efficacy.

DETAILED DESCRIPTION OF THE ILLUSTRATIVE EMBODIMENTS

Although embodiments of the present invention will be described with respect to a gantry-style pick and place machine, those skilled in the art will recognize that embodiments of the present invention are applicable to other forms of pick and place machines.

Figure 1:
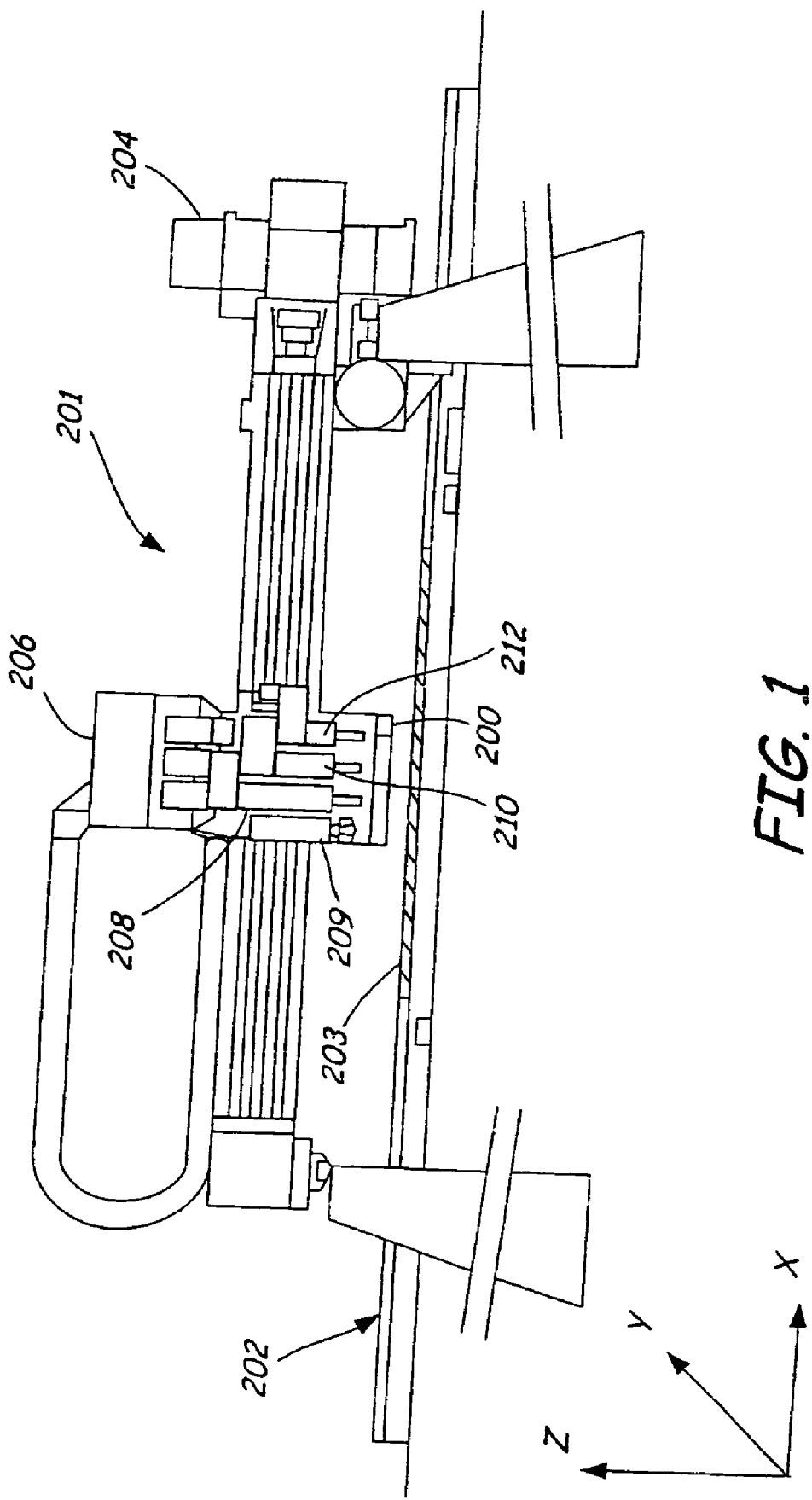
FIG. 1 is a diagrammatic view of a pick and place machine with which embodiments of the invention can be practiced.

FIG. 1 is a diagrammatic view of an exemplary pick and place machine 201 with which embodiments of the present invention are applicable. Pick and place machine 201 receives a workpiece, such as circuit board 203, via transport system or conveyor 202. A placement head 206 then obtains one or more electrical components to be mounted upon workpiece 203 from component feeders (not shown) and moves in x, y and z directions to place the component in the proper orientation at the proper location upon workpiece 203. Placement head 206 may include a sensor 200 that may pass under components held by nozzles 208, 210, 212 as placement head 206 moves the component(s) from pickup locations to placement locations. Sensor 200 allows placement machine 201 to view undersides of components held by nozzles 208, 210, 212 such that component orientation and, to some degree, component inspection can be effected while the component is being moved from the component pick-up location to the placement location. Other pick and place machines may employ a placement head that moves over a stationary camera to image the component. Placement head 206 may also include a downwardly-looking camera 209 which is generally used to locate fiducial marks upon workpiece 203 such that the relative location of placement head 206 with respect to workpiece 203 can be readily calculated.

Figure 2:
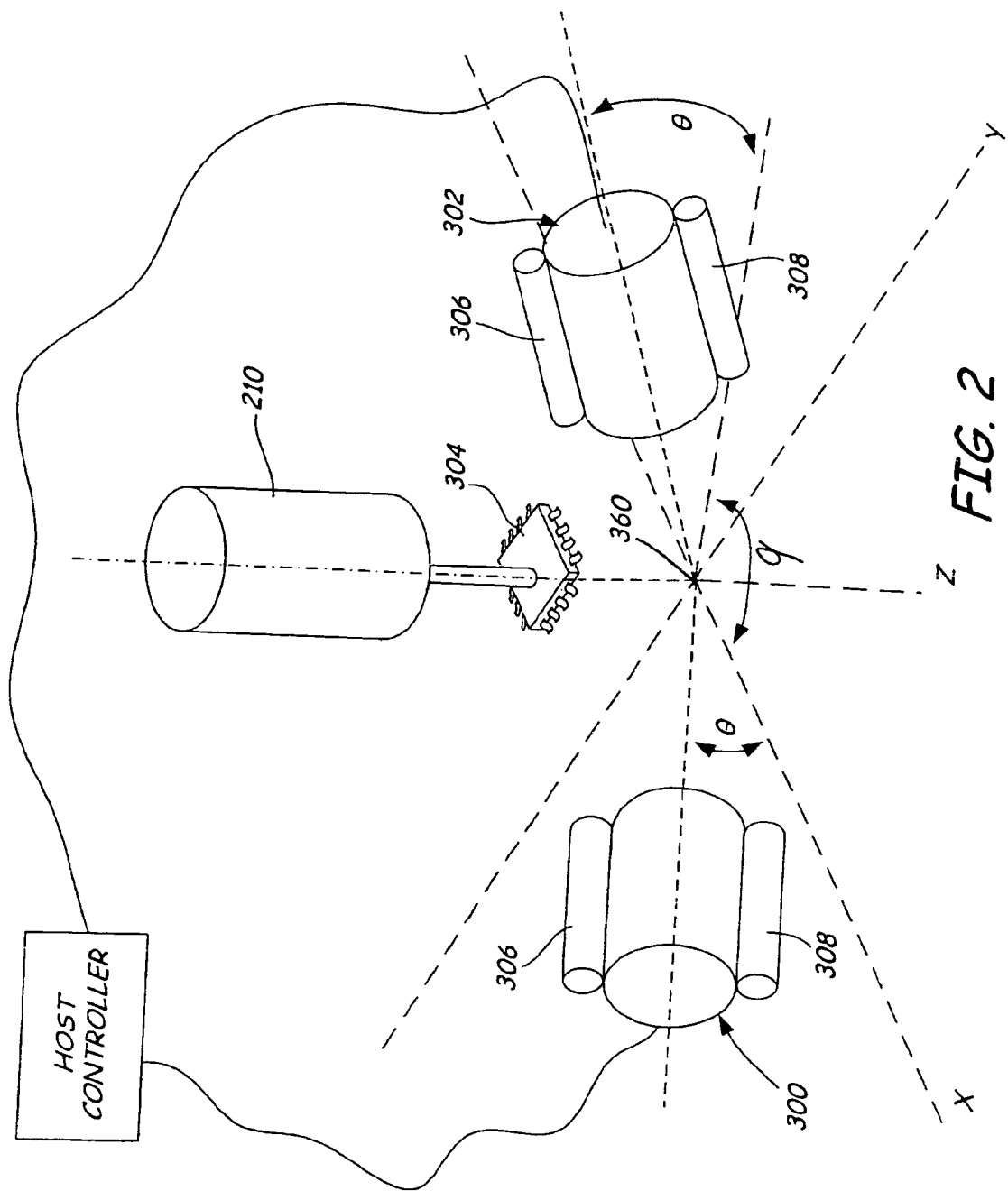
FIG. 2 is simplified diagrammatic view of a stereovision image acquisition system in accordance with embodiments of the present invention.

FIG. 2 is a diagrammatic view of a placement head in accordance with embodiments of the present invention. FIG. 2 illustrates a pair of image acquisition devices 300, 302 disposed to acquire images of placement location 360 of component 304 before component 304 is deposited by nozzle 210 upon location 360. Devices 300 and 302 obtain images of placement location 360 on workpiece 203 prior to placement of component 304, and then shortly thereafter. A comparison of these before and after images facilitates component-level placement inspection and verification. Since acquisition of images of the placement location is generally done when the nozzle, such as nozzle 210, holds the component 304 above the placement location, it is important to be able to image placement location 360 while minimizing or reducing interference from the component itself or adjacent components which may be already mounted upon the workpiece. Thus, it is preferred that devices 300, 302 employ an optical axis allowing views that are inclined at an angle θ with respect to the plane of workpiece 203. In order to compensate for the angle θ from which devices 300, 302 view placement location 360, it is preferred that devices 300, 302 be adapted to employ the Scheimpflug condition. One particular way in which the Scheimpflug condition can be employed is adapting the area array detector within each of devices 300, 302 to be disposed at an angle with respect to the optical train axis of the respective device 300, 302. Under this condition, the tilted object plane (placement location) is imaged properly onto the tilted image plane (area array detector within device 300, 302).

As illustrated in FIG. 2, devices 300, 302 are also preferably angularly spaced by an angle φ about the z-axis such that devices 300, 302 provide stereovision imaging of placement location 360. Such stereovision imaging provides a number of benefits which will be described in greater detail below. Stereovision imaging of the before and after condition of the placement location allows height maps to be generated with x-y data. Two advantages of stereovision imaging are: the generation of a depth map of the intended component placement location; and the ability to minimize, or at least reduce, the possibility that the component view will be occluded by another taller component along the line of sight. If the component view is occluded from one point of view, it will generally still be visible with the other camera.

Each of devices 300, 302 also preferably includes non-structured illuminator 306 and structured illuminator 308. While non-structured illuminators 306 are illustrated as disposed on each of devices 300, 302, it may be possible, in some embodiments, to provide a single non-structured illuminator mounted separately.

The system illustrated in FIG. 2 provides a number of features that can be used alone, or in combination to provide advanced component inspection. One way in which the system can be used is by employing structured light to reconstruct heights from any one view of placement location 360. Another way is to use structured light simply as an illumination source to provide patterns of light on the surface of the location 360, then use known correlation algorithms such as that reported by Rosenfeld, A., and A. C. Kak, 1982. Digital picture processing. Volume 2. Academic Press, New York to correlate the structured illumination between two images acquired from different views and from the two stereo images to compute a map of heights of the surface of the board, either pre or post placement. As used herein, structured light includes sinusoidal patterns, a regular array of spots or shapes, a random pattern of light, and even pseudo-random patterns of light. Occasionally, there will be situations and nozzle configurations when some portions of the workpiece surface do not appear in one of the images. Additional cameras can be arranged to view portions of the surface of the workpiece which are likely missing from one or more of the images. Alternately, it may be possible to piece together the missing image portion from other views, pre or post placement, to acquire the necessary images to provide either the information about the quality of placement, or the stereo information necessary to provide height information.

Figure 3:
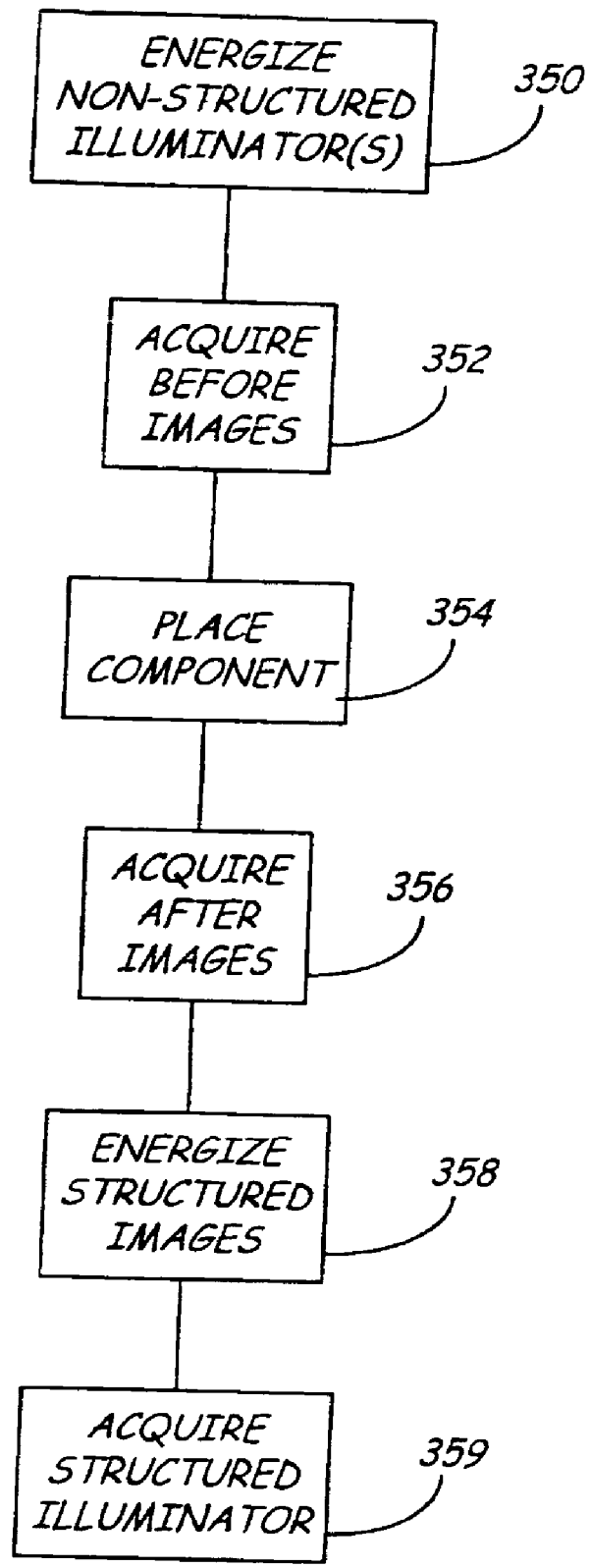
FIG. 3 is a flow diagram illustrating a method of operating a pick and place machine in accordance with an embodiment of the present invention.

FIG. 3 is a flow chart of a method of obtaining images in order to provide component-level inspection in a pick and place machine. At step 350, one or more non-structured illuminators (such as illuminators 306) are energized to illuminate the intended placement location prior to component placement. At step 352, each of devices 300, 302 acquire a pre-placement image of the placement location while it is illuminated with non-structured illumination. Preferably, devices 300, 302 acquire their respective images simultaneously, or at substantially the same time as each other. As used herein, substantially the same time means close enough in time that the physical system has not moved appreciably between image acquisitions. Thus, stereovision pre-placement image acquisition is effected at step 352 and the non-structured illuminator(s) are de-energized. Optionally, stereovision before-images or images of structured illumination upon the intended component placement location can be used for pre-placement inspection operation. Such operations include: the verification that solder paste is deposited in appropriate positions to receive associated component leads; that no debris or other undesirable material is located in the intended placement location; or any other inspection operations as may be desired.

A structured illumination image can be acquired from each image acquisition device to provide three-dimensional image information of the intended component placement location prior to component placement. In the event that each image acquisition device uses its own structured illuminator, the image acquisition devices should acquire their respective images sequentially such that structured illumination from one image acquisition device does not interfere with that of the other. However, if suitable structured illuminators are used, such that the structured illumination from each illuminator can be disambiguated in processing, then the image acquisition devices can each acquire their respective structured illumination images simultaneously.

At step 354, the nozzle, such as nozzle 210, places the component in its intended placement location. At step 356, devices 300, 302 again obtain a stereovision image of the placement location, post placement. Optionally, at step 358, structured illuminators 308 can be energized to impart structured illumination upon component 304 as it sits in its intended placement location. Devices 300, 302 can then optionally obtain yet another set of stereovision images while the intended placement location is illuminated with structured illumination (block 359). Optional steps 358 and 359 facilitate the generation of a three-dimensional reference point image of the intended placement location, post placement.

Figure 4:
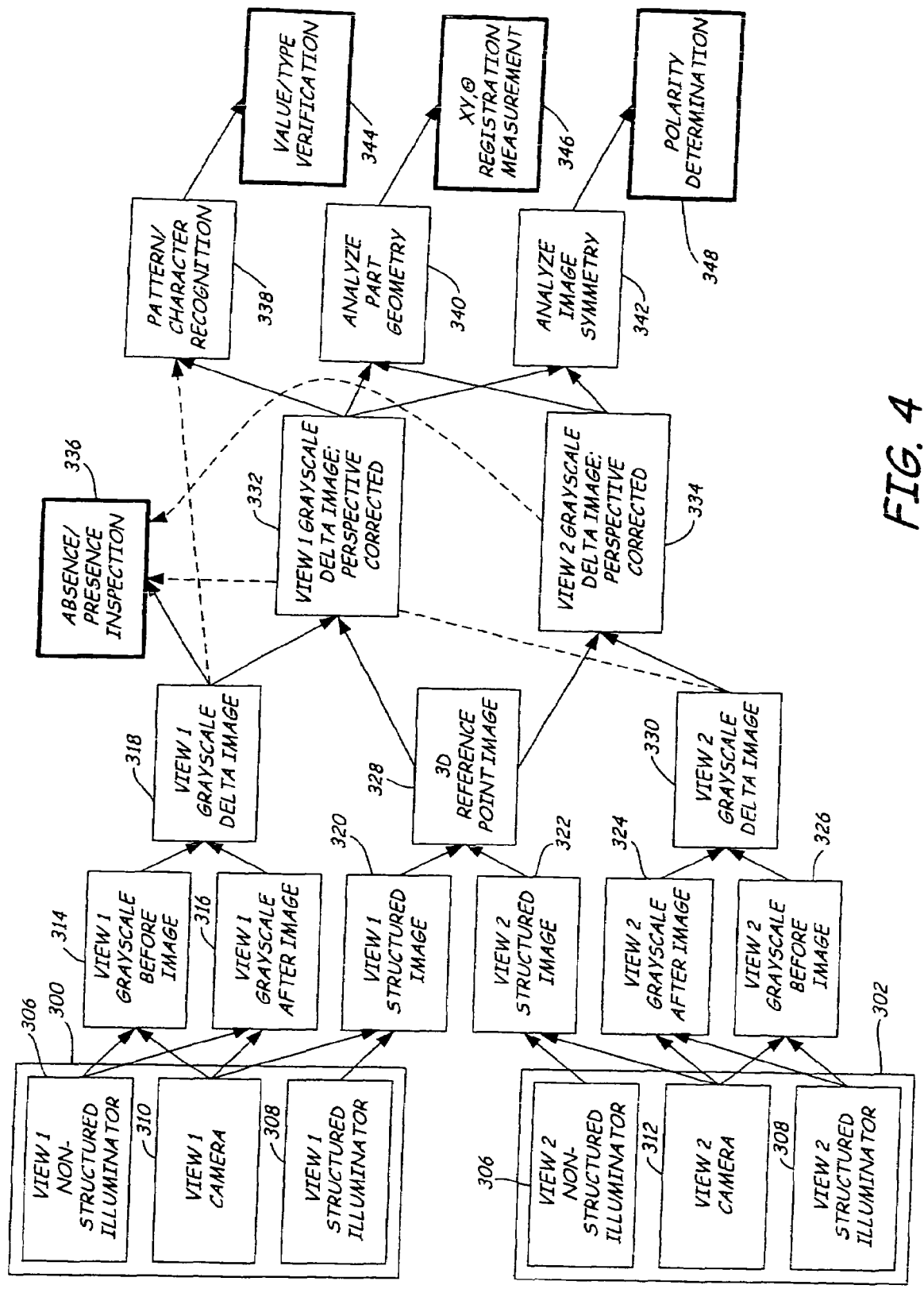
FIG. 4 is a block diagram illustrating how various images can be used and/or combined to provide component placement inspection in accordance with an embodiment of the present invention.

FIG. 4 is a diagrammatic view of how the various illuminators and image acquisition devices are used to generate various images and how those images combine to provide important inspection information. As illustrated in FIG. 4, device 300 includes non-structured illuminator 306, camera 310, and structured illuminator 308. Device 302 includes non-structured illuminator 306, camera 312, and structured illuminator 308. As can be seen, camera 310 and non-structured illuminator 306 of device 300 cooperate to generate both gray-scale before image 314 and gray-scale after image 316, which images are then used to generate a gray-scale difference (delta) image 318 corresponding to the view from device 300. Additionally, camera 310 and structured illuminator 308 cooperate to generate the structured image 320 from the view of device 300.

Device 302 produces images 322, 324 and 326 similar to that described above with respect to device 300, but from a different view such that stereovision images are facilitated. Specifically, image 322 is preferably acquired simultaneously with or substantially simultaneously with the acquisition of image 320. Similarly, images 324 and 326 are acquired at substantially the same time as images 316 and 314, respectively. The two structured illumination images 320 and 322 taken from the different views of devices 300, 302, respectively, can be combined to provide three dimensional reference point image 328. Additionally, the gray-scale images obtained by device 302 can be combined to provide gray-scale delta image 330. The three dimensional reference point image 328 is used to correct each of the gray-scale delta images 318 and 330 for perspective, thereby forming first and second view gray-scale delta images with corrected perspectives, 332 and 334, respectively. The perspective-corrected gray-scale images 332 and 334 can then be used for a number of component placement inspections. Examples of such inspections can include absence/presence inspection, as indicated at block 336; pattern/character recognition as indicated at block 338, part geometry analysis as indicated at block 340, and image symmetry analysis as indicated at block 342. Pattern/character recognition 338 on the component 304 itself facilitates verification of the correct type and value of component 304, as indicated at block 344. Additionally, by analyzing part geometry, x, y and rotational ($\theta$) registration can be measured and verified, as indicated at block 346. Finally, analyzing image symmetry, as indicated at block 342, can provide a convenient approach to analyze component polarity as indicated at block 348. Verifying the placement of a component on a printed circuit board can be done by acquiring before-placement and after-placement images of a location on the circuit board where the component is expected to be placed, and then subtracting one image from the other. The part of the image that does not change between the before and after pictures is thereby suppressed and artifacts of the newly placed component are clearly present in the resulting image. The before-placement and after-placement images are not generally perfectly aligned, however, due to mechanical vibration, inaccurate mechanical motion, or because the printed circuit board and/or cameras are in motion when the images are acquired. When the two images (before and after) are not aligned, artifacts appear in the resulting differenced image which may be a false indicator that the component is present. One technique to estimate the misalignment of the two images is using correlation (e.g. normalized gray-scale correlation). However, correlation only works if orthogonal edges are present in the template (area of the image being correlated). If no edges are present or edges in only one direction are present, the correlation will not produce a unique (x, y) location for alignment.

Preferably, the correlation of the before-placement image with the after-placement image is done using the entire field of view (FOV) of the images. This is especially so when most of the information-containing features (edges, typically) are the same. This is the case when the placed component takes up only a small fraction of the field of view. Alternatively, a region of interest (ROI) can be established that encompasses all or most of the placed component. Then, that region can be excluded from the images prior to performing the correlation. The actual correlation can be effected via a number of known methods. Such methods include, but are not limited to, normalized grayscale correlation (NGC) and "smart" correlation algorithms such as VsFind. More often, a simple translation of one image relative to the other is enough to produce a very high correlation. Small differences, attributed to the warping of the workpiece can appear as slight rotations and can be accommodated with more sophisticated scaling and/or morphing during the correlation search.

Another technique that can be used to improve correlation is the identification of features in the images that are fixed and thus able to provide an internal reference. Accordingly, for comparing two images of substantially the same field of view, constant background features common to both images can be used to "co-register" the images. These fixed features provide the internal reference, in each image, to a common coordinate system. The exact position of the background feature(s) is not significant, the only requirement is that such feature(s) maintain a constant relationship relative to one another from image to image. Not only translation and rotation, but relative warping and stretching can be determined provided there are sufficient background features. Typical background features include printed circuit board pads, traces, artwork, vias and solder paste deposits. The utility of any of such features depends on the degree to which they are believed to be constant from image to image. These fixed printed circuit board features, such as lands and traces, are consistently located relative to each other. Accordingly, they are effectively traceable back to the fiducial reference frame. Intended component placement locations are usually determined based on the detected position of fiducials. Accordingly, this reference indicates how near to its intended site a component was placed. Further, solder paste deposits can also be used as fixed internal reference points. Component placement success may depend on proper contact with solder on the placement site provided that the solder is registered well enough to the workpiece. This reference may then be a more practical approach given variations in solder paste position on pads. Circuit features and solder paste are evident in all regions of a printed circuit board subject to component placement.

Vision systems, such as those used in accordance with embodiments of the present invention, may be able to pick good locations for templates if CAD data were available and the vision system knew where on the board it was looking relative to the CAD description. Alternatively, if the vision system could be taught off-line by being shown every possible field of view, the vision system could pre-determine good locations or templates. However, if neither of these conditions is true, then the vision system needs to quickly determine good template locations during run-time.

Figure 6:
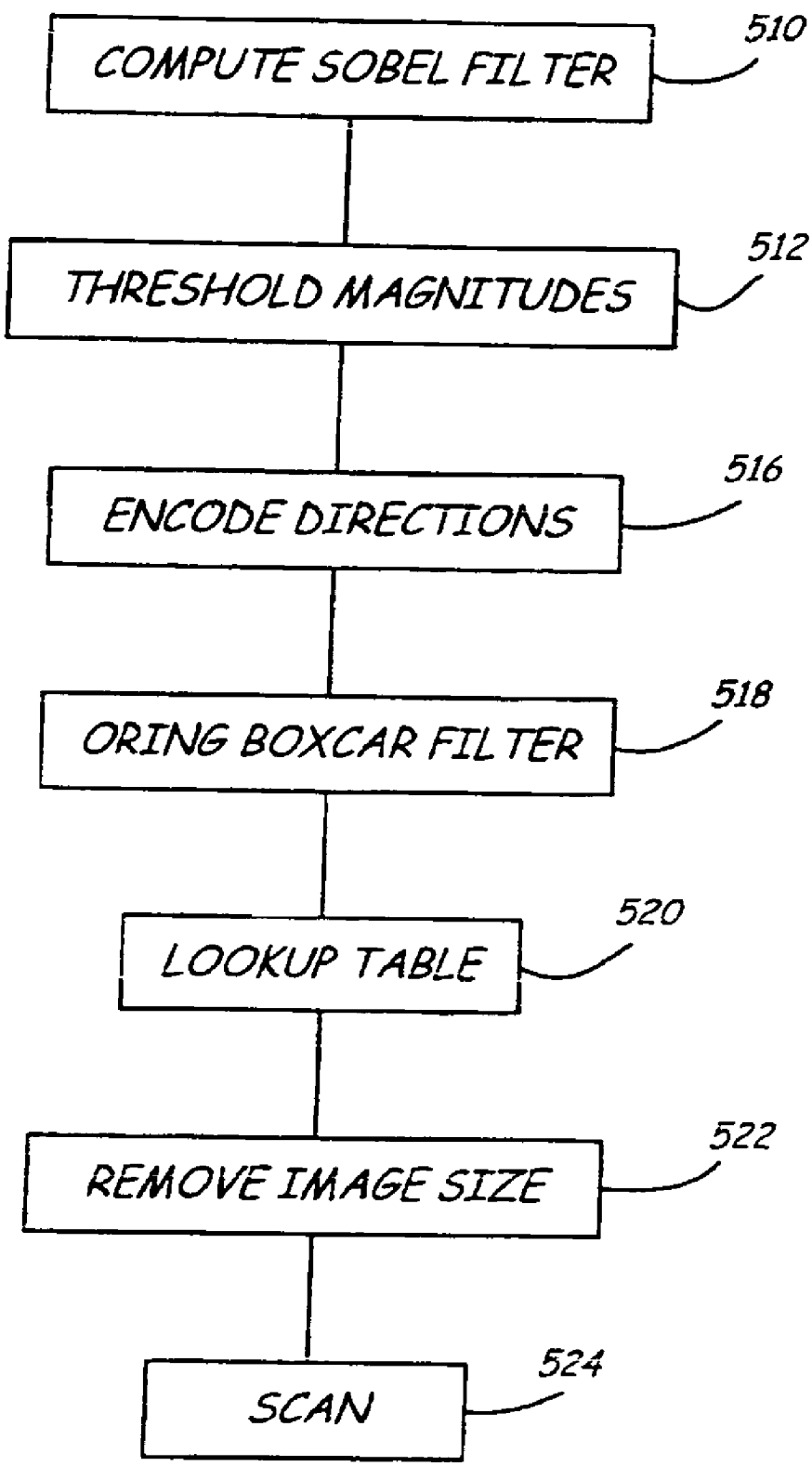
FIG. 6 is flow diagram of a method of identifying locations within acquired images that facilitate image comparisons in accordance with embodiments of the present invention.

One aspect of embodiments of the present invention provides an efficient computational method for determining good locations in one image for selecting a template for correlation in another image. The method is illustrated in FIG. 6 and begins at block 510 where a Sobel edge filter is computed on the before-placement image, computing both the magnitude and direction of the strongest edge around every pixel. (Alternatively, a simpler gradient operation could be used in a 3×3 neighborhood around every pixel). At block 512, the edge magnitudes are thresholded and the edge directions are rounded to one of eight degrees: 0, 45, 90, 135, 180, 225, 270 and 315 degrees.

Figure 7:
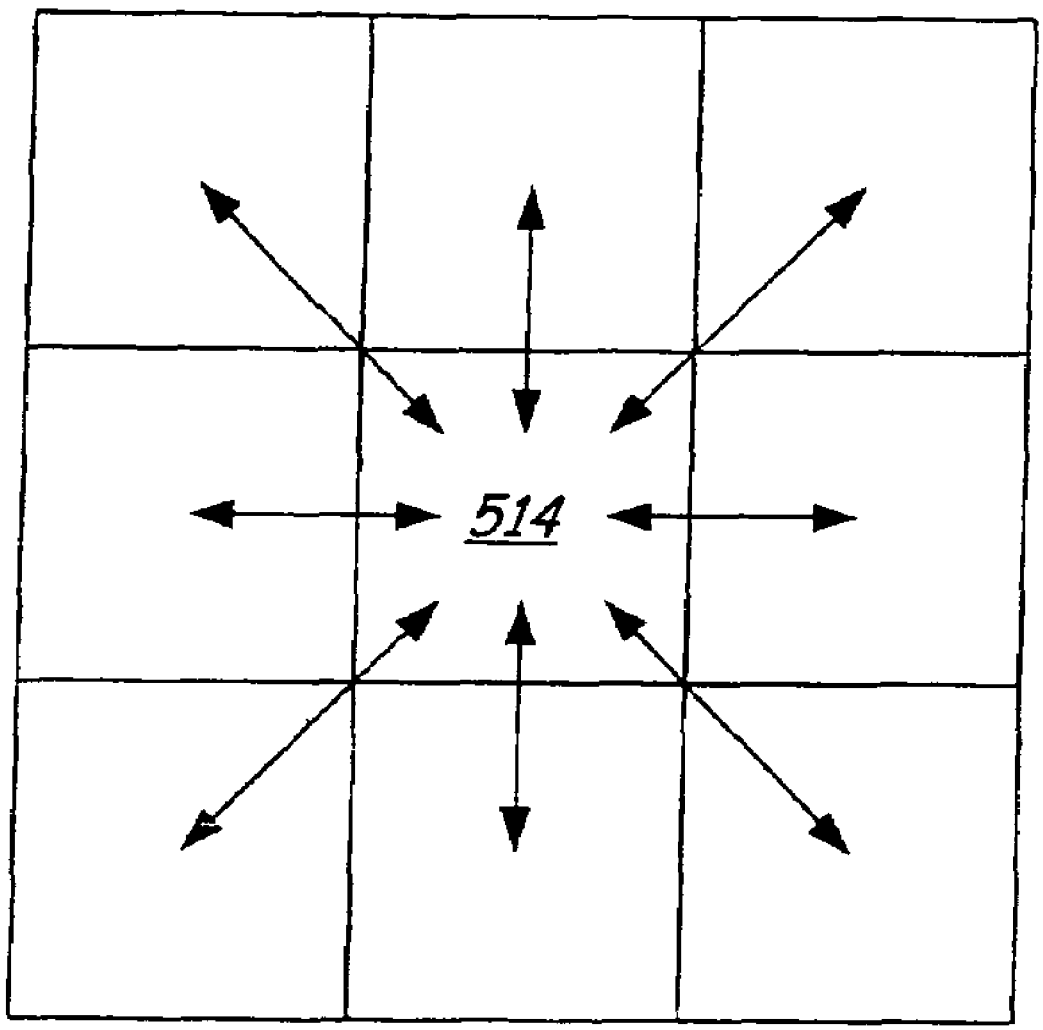
FIG. 7 is a diagrammatic view of a pixel and its surrounding neighbors.

FIG. 7 illustrates a pixel 514 and its eight neighbors. Each arrow indicates a normal edge direction. At block 516, the eight directions are encoded for each pixel into an eight-bit byte (edge-encoded pixel). The eight directions listed in this step can be described by their compass directions as follows: east-7, northeast-6, north-5, northwest-4, west-3, southwest-2, south-1 and southeast-0. At block 518, an OR'ing boxcar filter is performed on the encoded data. Unlike a normal boxcar filter, which computes an average like a low-pass filter, this OR'ing boxcar filter performs a bit-wise OR operation on the pixels within the aperture neighborhood. The aperture may be 5×5 pixels or 7×7 pixels (or some other size as appropriate). In the resulting "image" of edge-encoded pixels, each pixel indicates which edge directions are present in its 5×5 or 7×7 neighborhood. At block 520, a predefined look-up table is used to assign scores to every eight-bit edge-encoded pixel in the image. Only a small number of scores (e.g., 4) are generally needed. Since eight-bit codes index into the look-up table, the look-up table need only be $2^8$ or 256 elements. The higher the score, the better the 5×5 or 7×7 neighborhood represented is for use in a correlation template. Of the 256 8-bit edge encodings, the vast majority are symmetrical, so only a few sample scores are shown in the following table.

TABLE 1

| Score | Sample 8-bit codes |
| --- | --- |
| 0 | ( ), (E), (E, W), (E, SE), (E, NW, W, SE) |
| 1 | (E, NE, SE), (E, NE, NW, W, SW, SE), (E, NE, W, SE) |
| 2 | (E, NE, S, SE), (E, W, SW, S, SE), (E, NW, W, SW, S, SE) |
| 3 | (E, NE, N, NW, W, SW, S, SE), (E, N, NW, W, SW, S, SE), (E, N, W, S), (E, NE, N, W, S) |

At block 522, the size of the image is reduced by summing 4×4 neighborhoods of scores. (In other words, a pyramid image is built). Alternatively, an additive boxcar filter can be applied on the image with a 4×4 or larger aperture size. Finally, at block 524, the resulting image of scores is scanned for high scores. The high scores indicate good locations in the original image that can be used as correlation templates. Since the component will be placed somewhere in the central part of the image, the search for high scores should be restricted to be outside of the central part of the image. (In fact, all of the above processing can avoid the central area of the image for the sake of efficiency.)

Another efficient technique for determining template locations without a priori knowledge of the placement location is based on the difference image signature itself. A well-isolated and repeatable difference image signature of the placed component provides a reliable and easily extracted template for NGC or other correlation searches of subsequent difference images. Accordingly, the before-placement and after-placement images can simply be correlated in accordance with any of the above-described techniques, then a difference image can be generated from the correlated before-placement and after-placement images. This difference image can be used directly as a template for subsequent example or can be adjusted slightly, such as generating a small window about the component, or any other suitable manipulation. Subsequent examples of placed components of the same type in similar orientations will generate a relatively high correlation score. Because the difference images contain little besides the single placed component, other instances of similar components in similar orientations will be suppressed. The difference image template can be used to locate the difference image signature of the placed component in subsequent difference images. Provided the changes in position in the image are sheer translation and shift are relatively modest, correlation methods will lock onto the signature reasonably well. Transnational shifts will be reasonably accurate and rotational changes that effect the appearance of the signature will diminish the correlation, but will be reasonably accurate over small angles. Correlation using difference image templates is believed to have far fewer image features to deal with and is targeted upon the proper component.

Figure 5A:
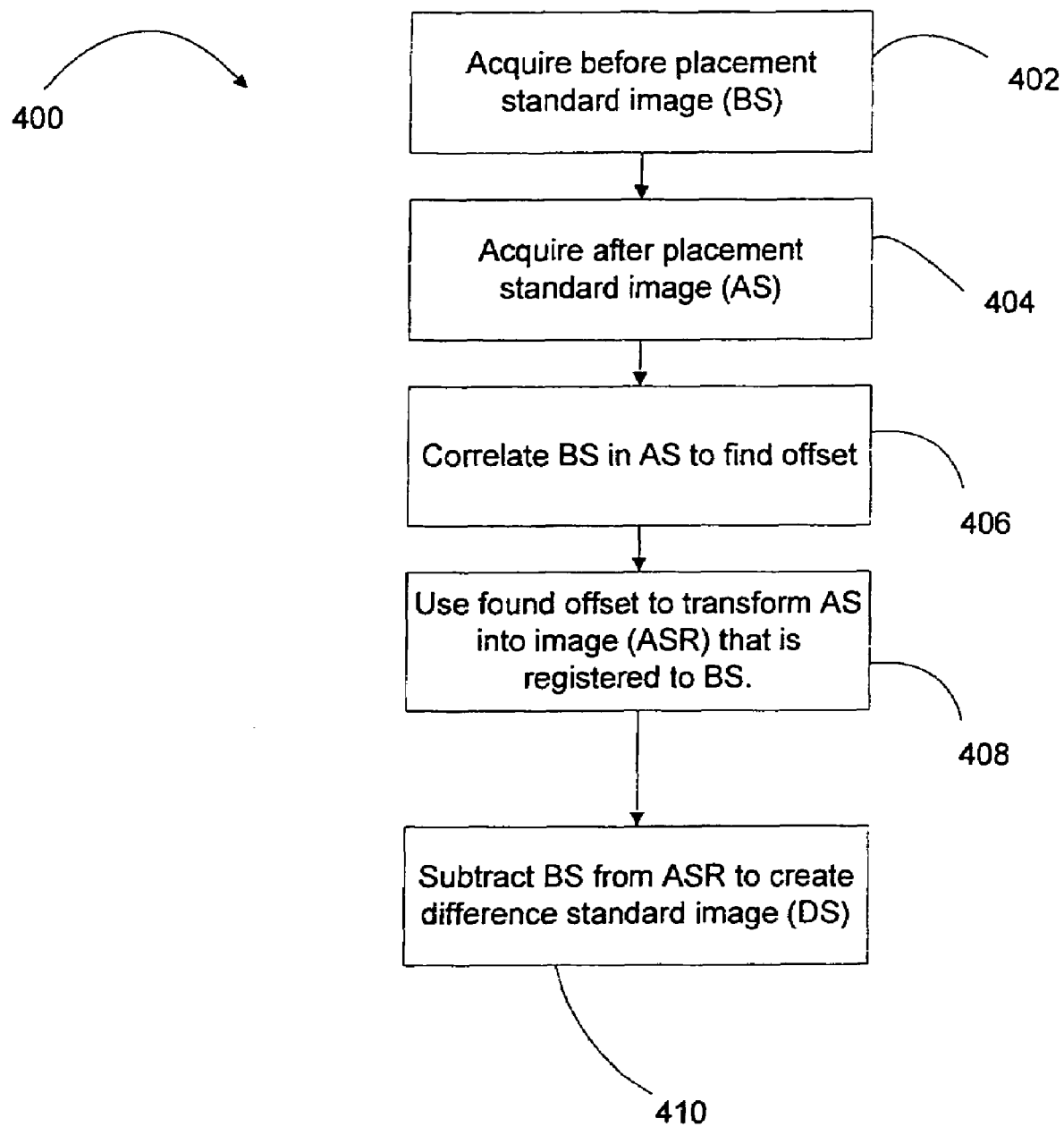
FIGS. 5a-5c illustrate a method of analyzing before and after images in a component placement machine in accordance with an embodiment of the present invention.
Figure 5B:
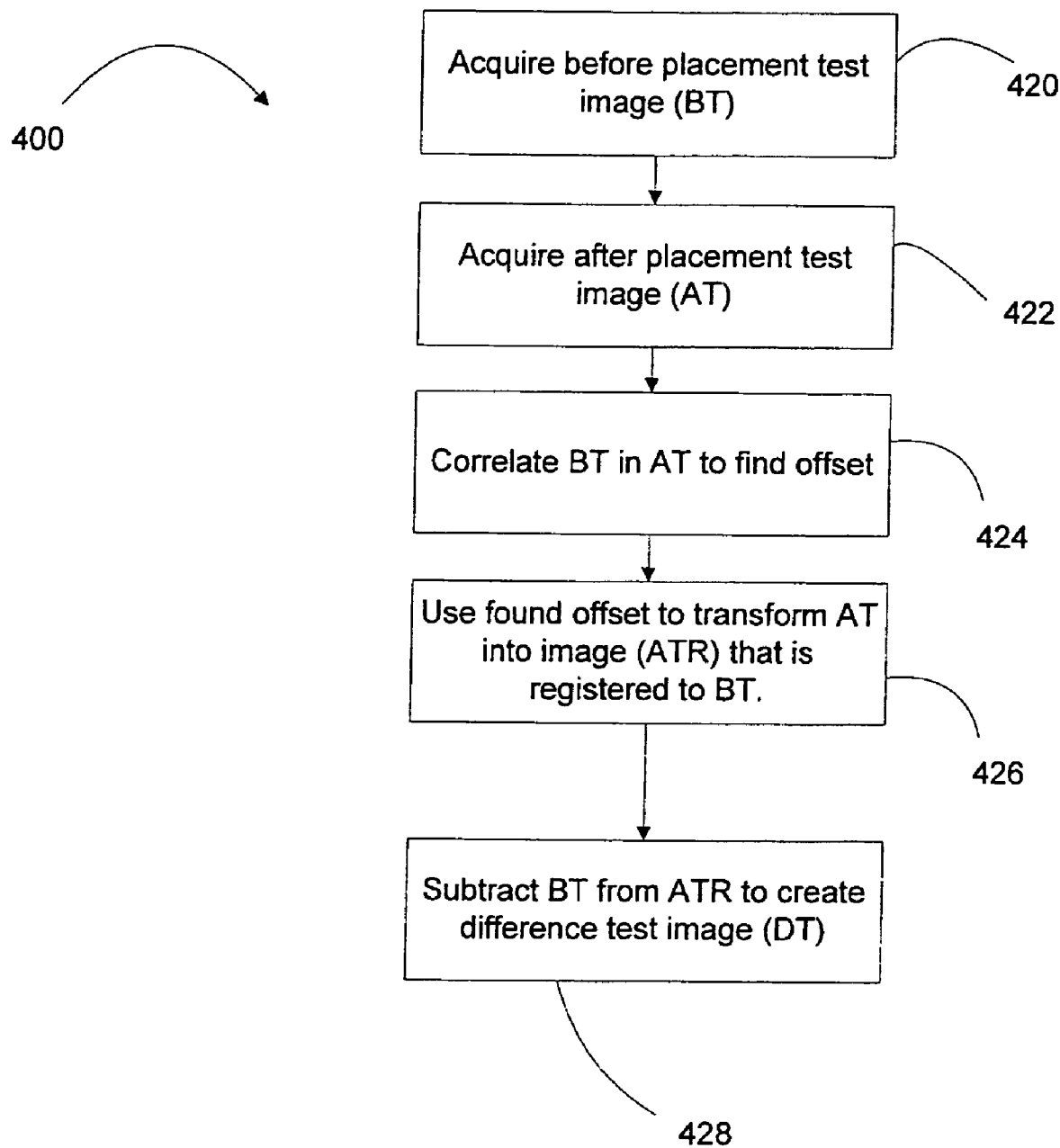
Figure 5C:
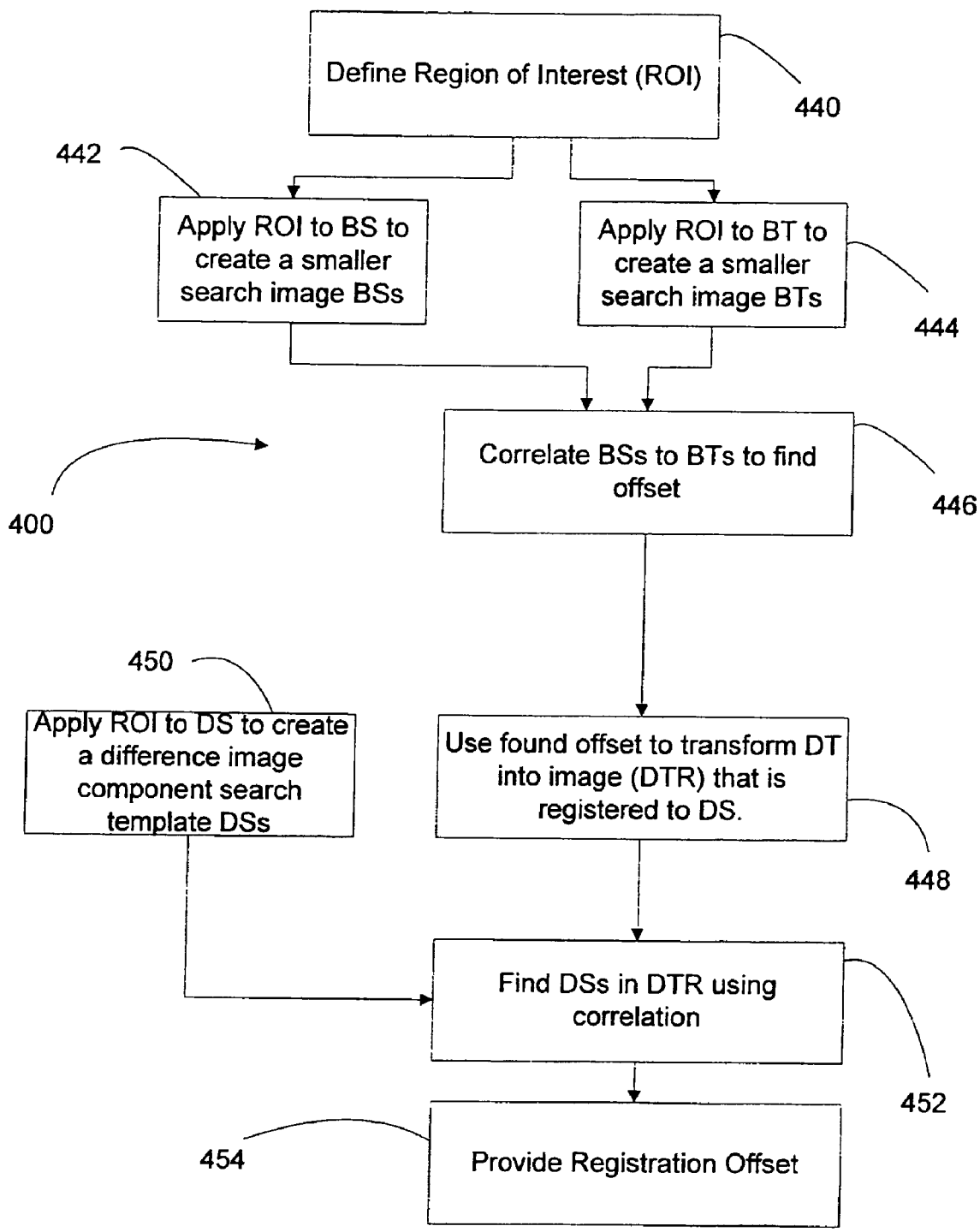

FIGS. 5a-5c illustrate a method of analyzing before and after images in a component placement machine in accordance with an embodiment of the present invention. Method 400 begins at block 402 where a vision system within the component placement machine acquires a before placement standard image (BS). Block 402 occurs during setup or calibration of the component placement machine when a known placement condition exists. Similarly, at block 404, the machine acquires an after placement standard image (AS). This "standard" placement is generated with respect to a "standard" component (meaning it is not generally part of the lot being manufactured) on a "standard workpiece" that is checked before the inspection of components placed during manufacture occurs. Further, this standard placement is verified as accurate by means external to the machine, such as a technician, or via other suitable methods.

At block 406, the before-placement standard image (BS) is correlated, via any suitable methods described above, with the after-placement standard image to generate an offset that relates two images together. For example, if movement of the workpiece occurred between the acquisition of the before and after images, the offset would theoretically indicate a vector representative of such movement.

At block 408, the offset is used to transform the after-placement image (AS) into an after-placement image that is registered to the before-placement standard image, This registered after-placement image is indicated as after-placement registered (ASR). At block 410, the before-placement standard image (BS) is subtracted from the after-placement registered image (ASR) to generate a standard difference image (DS).

Method 400 continues in FIG. 5b which is similar to that described with respect to FIG. 5a. The main difference is that the portion of the method shown in FIG. 5b executes for actual placed components. At block 420, a before-placement image (BT) is acquired prior to placement of a component being placed during manufacture of the workpiece. Once the component is placed, block 422 executes and the placement machine acquires an after-placement image (AT). Block 424 is similar to block 406, but operates upon images (BT) and (AT) to generate an offset vector that relates the two.

At block 426, the offset vector determined during block 424 is used to transform image (AT) into an after-placement image (ATR) that is registered to before-placement image (BT). At block 428, image BT is subtracted from the registered after-placement image (ATR) to generate difference test image (DT).

Method 400 continues in FIG. 5c at block 440 where a region of interest is defined. This definition can be provided by a technician manually. Alternatively, the region of interest can be generated automatically as a function of difference standard image (DS) as described above. One such function may simply provide a small window about the difference standard image (DS) to generate the ROI. At blocks 442 and 444, the ROI is applied to the before-placement standard image (BS) and the before-placement test image (BT) to generate smaller search images BSs and BTs, respectively.

At block 446, search image BSs is correlated to test image BTs to generate an offset vector relating the two. The offset vector is used in block 448 to transform the difference test image (DT) into a difference test image that is registered (DTR) to difference standard image DS.

At block 450, the ROI is applied to the difference standard image DS to generate a difference image component search template DSs. Then, at block 452, the difference image component search template DSs is correlated to the difference image test image (DTR). Finally, at block 454 the offset vector determined from the correlation performed in block 452 is provided by the placement machine. This offset vector is related to the registration offset of the placed component with respect to the standard, and thus provides a measure of placement efficacy.

Figure 8:
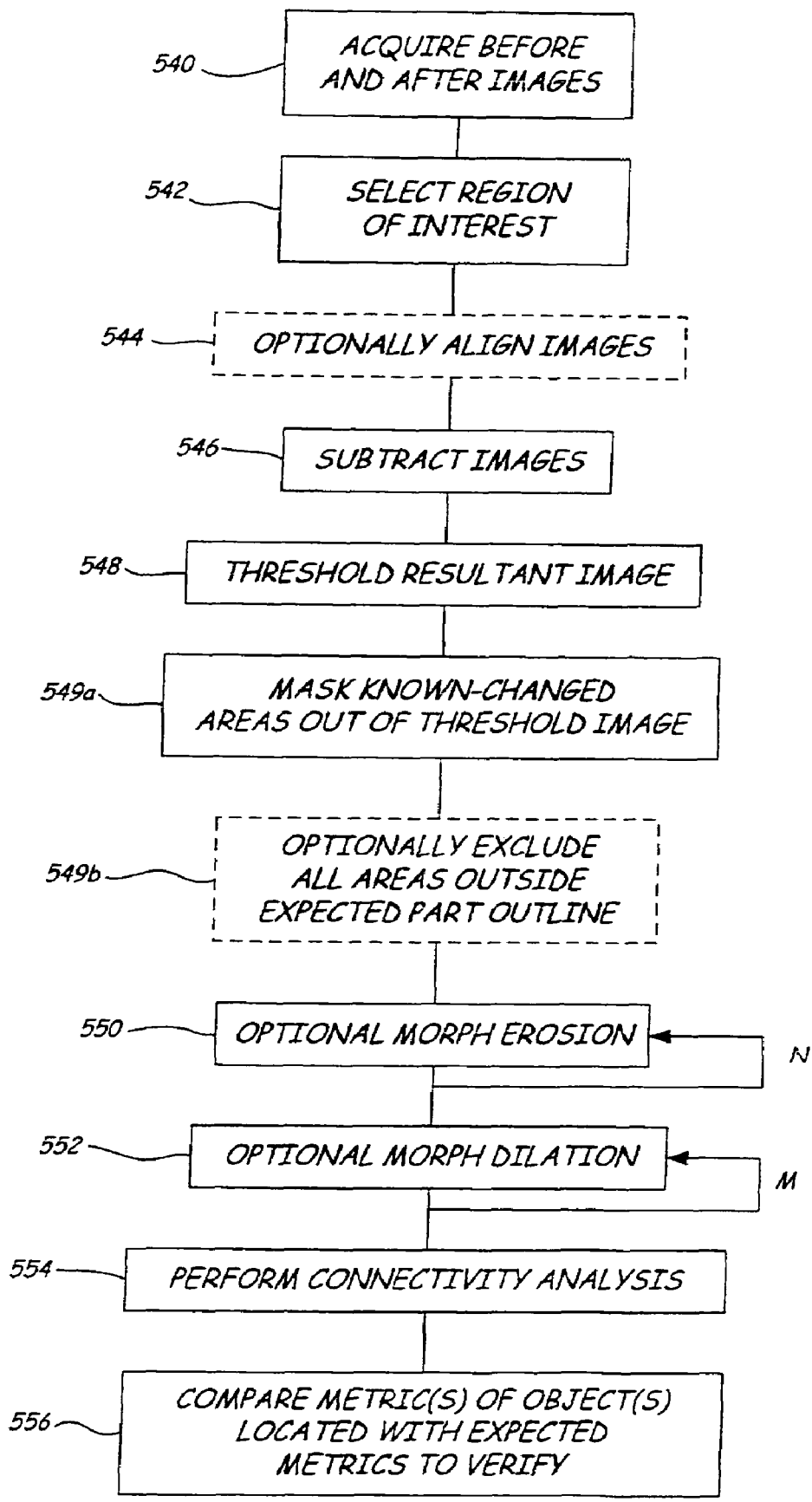
FIG. 8 is a diagrammatic view of a method for analyzing images to provide component placement verification in accordance with an embodiment of the present invention.

FIG. 8 illustrates a method of analyzing acquired images to determine component absence/presence, block 336, in accordance with an embodiment of the present invention. At block 540, both before and after images are acquired. Dashed block 544 indicates an optional step of aligning the two images using one-dimensional or two-dimensional correlation. Preferably, the alignment method described above with respect to FIGS. 6 and 7 is employed. At block 546, the aligned before and after images are subtracted from one another. Every pixel is given its absolute value. This step highlights changes in the image, and hence highlights the difference between the two images. At block 548, the differenced image is thresholded. Thresholding the differenced image creates a binary image that distinguishes areas of change from areas of no change.

In block 549a, areas known to always change between the two images, such as the nozzle and reflections of the nozzle, are masked out of the thresholded image. This masking is accomplished by drawing filled black polygons in an otherwise white mask image over the regions known to change. The known-changed mask image is then ANDed with the thresholded image. Optionally, if component data including the length, width, and height of the component are available, in block 549b, the system generates a white mask covering the two-dimensional projection at the image plane of the volume expected to be occupied by the part in an otherwise black image. This masking is accomplished by drawing a white filled polygon in an otherwise black mask image over the region where the part will be placed. The expected part mask image is then ANDed with the thresholded image.

At block 550, optional morphological erosion operations can be performed one or more times, as indicated by the loop marked "N". This erosion is useful for removing small objects that are the result noise or image misalignment. At block 552, another optional morphological operation is provided. Specifically, block 552 provides an optional dilation operation that can be performed one or more times, as indicated by the loop marked "M". The dilation operations facilitate merging portions of a single object that may have been separated by the erosion operation or by features of the component which matched the background image. At block 554, connectivity analysis is performed to find objects in the image. This analysis generates many useful metrics on each of the objects in the image, such as object centroid, length, width, area, rotation etc. (Gleason, et al., "A Modular Vision System for Sensor-Controlled Manipulation and Inspection", Proc. 9$^{th}$ Symposium on Industrial Robots, March 1979, pp. 57-570.) Finally, at block 556, the component placement is verified by comparing the metrics of the objects found in the images with expected object metrics. This comparison may include, but is not limited to, such metrics as centroid location, width, area, rotation, etc.

Figure 9:
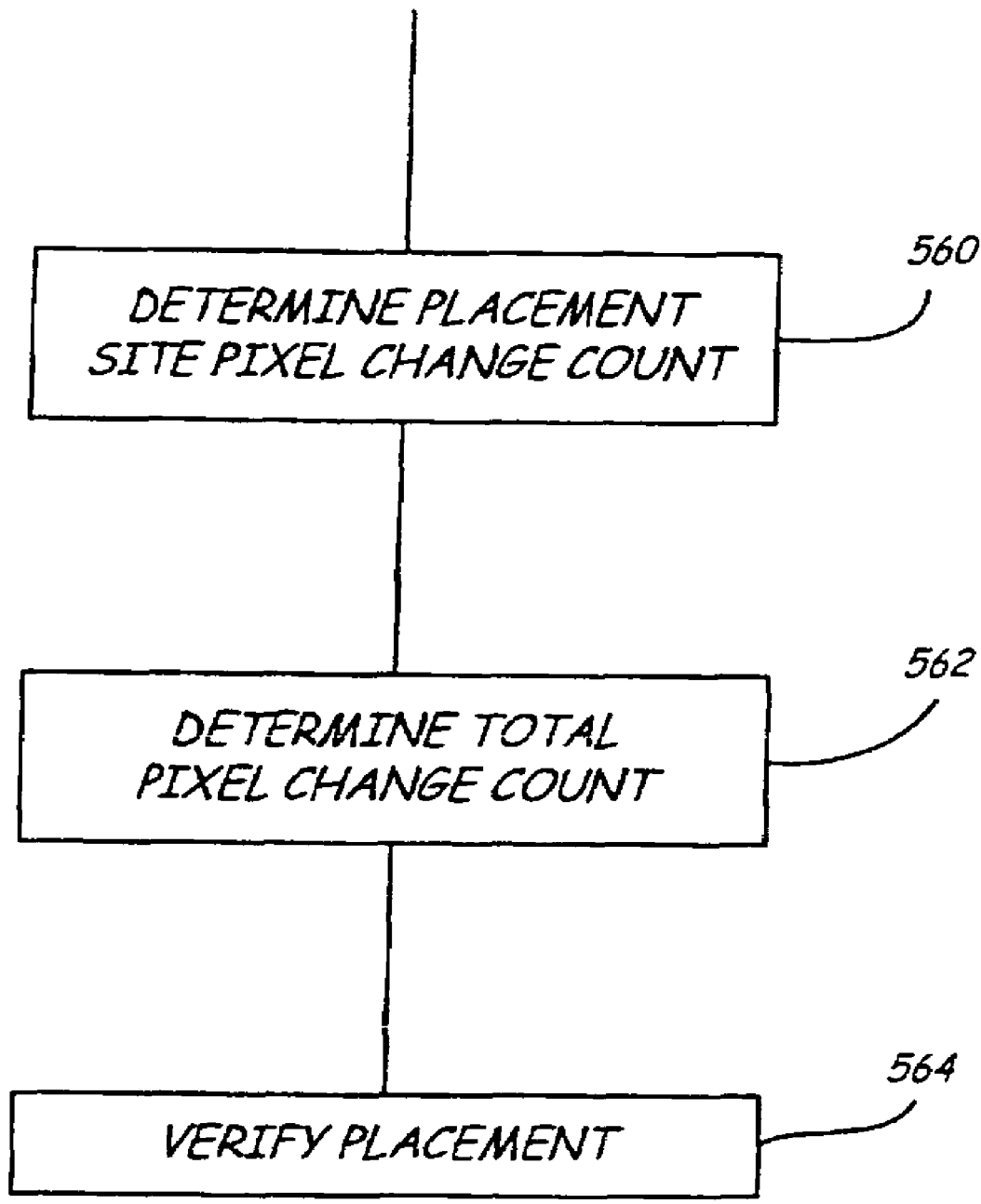
FIG. 9 is a diagrammatic view of another method for analyzing images to provide component placement verification in accordance with an embodiment of the present invention.

FIG. 9 is a diagrammatic view of another method for analyzing images to determine component absence/presence in accordance with an embodiment of the present invention. The method illustrated in FIG. 9 also includes steps 540, 542, 544 and 546 described with respect to FIG. 8. Accordingly, those steps are neither described nor shown in FIG. 9, which begins with step 560 that executes after step 546. At block 560, the pixel change count of the placement site is determined. This is accomplished by counting pixels whose value is above some threshold and also within a region of the image where the component is expected to be placed. At block 562, the total pixel count is determined by counting pixels whose value is above some threshold and not in the region of the image where the component is expected to be placed. At block 564, component placement verification is performed by comparing the Placement Site pixel change count (Block 560) with the Total pixel change count (Block 562).

Figure 10:
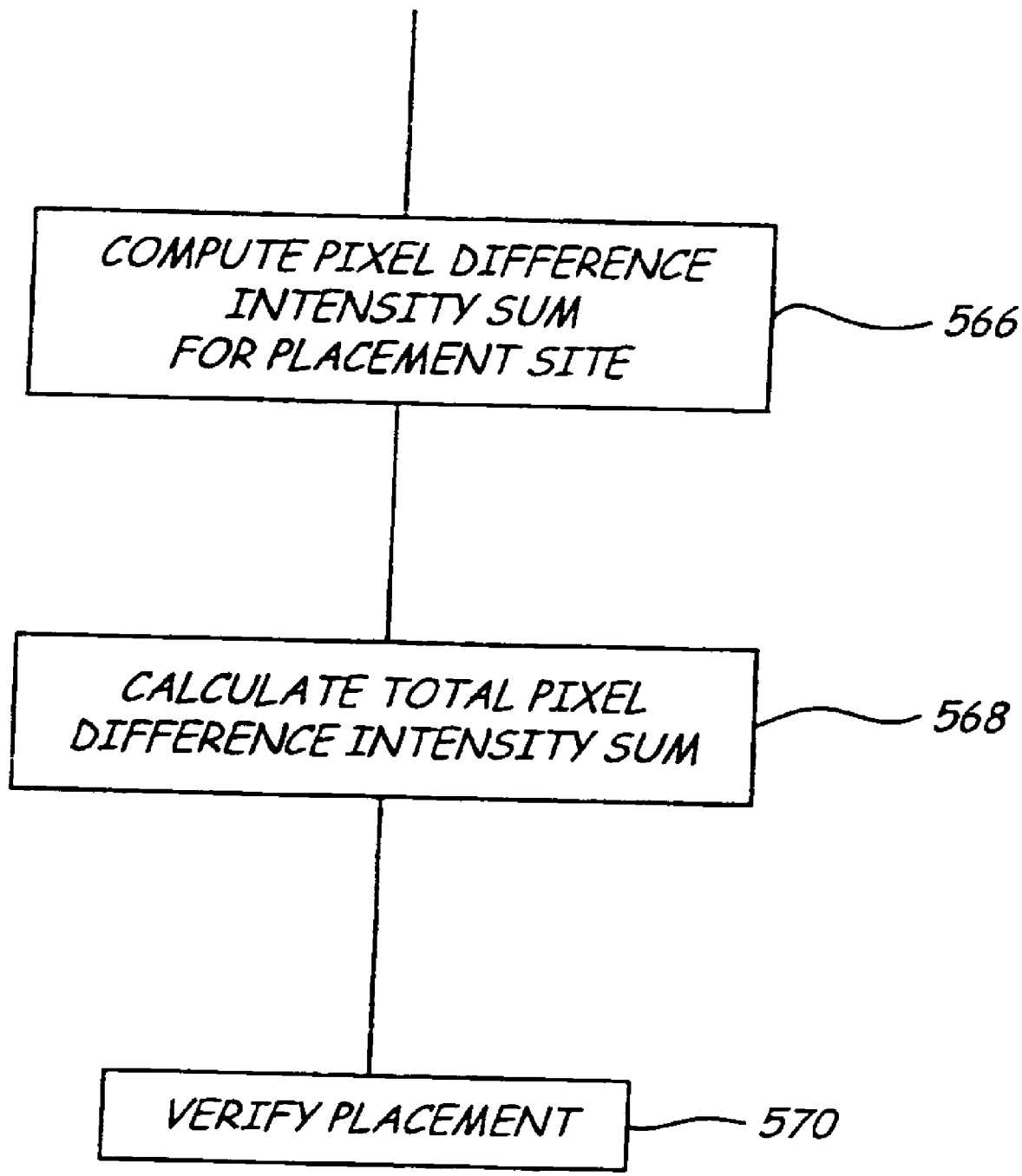
FIG. 10 is a diagrammatic view of yet another method for analyzing images to provide component placement verification in accordance with an embodiment of the present invention.

FIG. 10 is a diagrammatic view of yet another method for analyzing images to determine component absence/presence, block 336, in accordance with an embodiment of the present invention. The method illustrated in FIG. 10 also includes steps 540, 542, 544, and 546, described with respect to FIG. 8. Accordingly, those steps are neither described nor shown in FIG. 10, which begins with block 566 that executes after step 546. At block 566, the Placement Site Pixel Difference Intensity Sum is calculated for the placement site by summing pixels whose value is above a threshold and also in a region of the image where a component is expected. At block 568, the Total Pixel Difference Intensity sum is calculated by taking the sum of pixel intensity values in the entire difference image. At block 570, component placement is verified by comparing the Placement Site Pixel Difference Intensity Sum to the Total Pixel Difference Intensity Sum.

Figure 11:
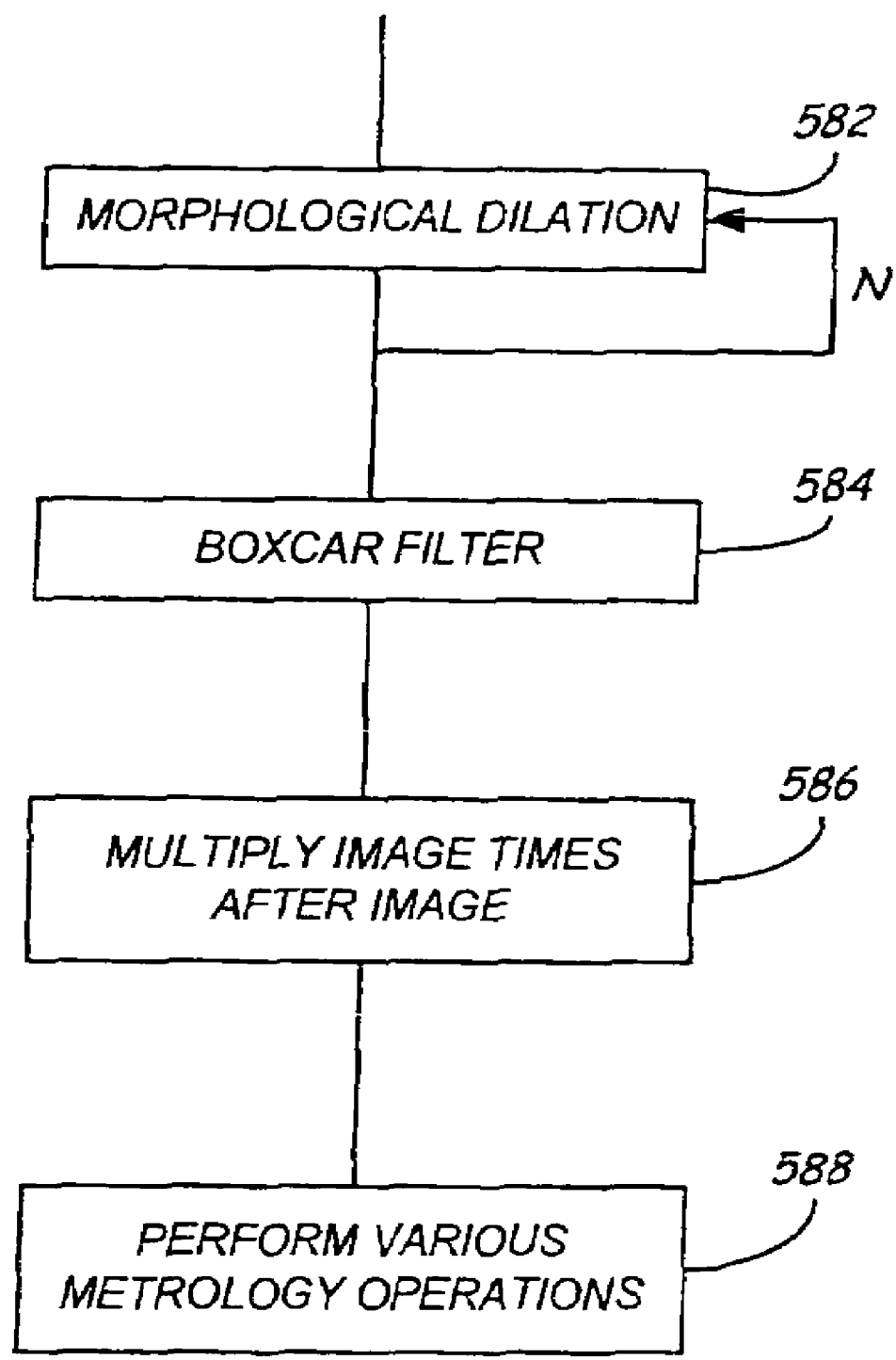
FIG. 11 is a diagrammatic view of a method for analyzing images for value/type verification, X, Y, θ positional registration measurement and polarity determination in accordance with an embodiment of the present invention.

FIG. 11 is a diagrammatic view of a method for analyzing images for "Value/type verification" [block 344 in FIG. 4], "X, Y, theta registration measurement" [block 346 in FIG. 4], and "Polarity determination" [block 348 in FIG. 4]. The method illustrated in FIG. 11 includes steps 540, 542, 544, 546, 548, 549a and 549b described with respect to FIG. 8. Accordingly, those steps are neither described nor shown in FIG. 11, which begins with step 582 that executes after step 549b.

The sequence of steps 544 to 549b and 582 to 584 produces a mask image. Steps 544 to 549b were described above. Step 582 performs multiple (e.g., five) 3×3 binary dilations on the thresholded difference image. Step 584 is a large boxcar filter (typically 19×19 pixels) to blur the dilated difference image. In step 586, the blurred mask image produced by step 584 is multiplied times the "after image" acquired in step 540. This isolates the placed component in the image, erasing the non-changing parts of the image. Multiplying the blurred mask times the after image is better than simply ANDing the non-blurred mask image with the after image because ANDing the mask with the gray-scale image would produce artificial edges along the perimeter of the mask.

Step 588 places various image metrology tools such as line fitters and "rulers" or "calipers" to locate the leads of components or, in the case of BGAs where the leads (actually balls) are hidden under the part, the four sides of the component. After the leads and/or sides of the component have been located, the X, Y, theta position of the component can be computed.

Similarly, Optical Character Recognition (OCR) or correlation can be used on the image produced at block 586 for "Value/type verification". Additional metrology tools can also be applied to the same image to determine polarity.

Although the present invention has been described with reference to preferred embodiments, workers skilled in the art will recognize that changes may be made in form and detail without departing from the spirit and scope of the invention.

What is claimed is:

1. A method of determining a location of a subsequent component on a subsequent workpiece, the method comprising:
   acquiring a before-placement standard image of an intended placement location on a standard workpiece using an image acquisition device;
   placing a standard component upon the standard workpiece using a robotic system of a pick and place machine and verifying placement of the standard component;
   acquiring an after-placement standard image including the standard component using the image acquisition device;
   creating a standard difference image from the before- and after-placement standard images;
   after acquiring the after-placement standard image, acquiring a before-placement test image of an intended placement location on a subsequent workpiece;
   placing a subsequent component upon the subsequent workpiece using the robotic system of the pick and place machine;
   acquiring an after-placement test image including the subsequent component;
   creating a test difference image from the before- and after-placement test images;
   calculating a first offset between the before-placement standard image and the before-placement test image;
   transforming the test difference image based on the first offset to generate a registered difference test image (DTR) that is registered to the standard before-placement image; and
   correlating the standard difference image to the registered difference test image (DTR) to generate a registration offset using a processor of a computer.

2. The method of claim 1, wherein creating the standard difference image further comprises correlating the standard before-placement image to the after-placement standard image.

3. The method of claim 2, and further comprising transforming the after-placement standard image based on the correlation.

4. The method of claim 3, wherein the correlation provides an offset vector relating the two images.

5. The method of claim 1, and further comprising defining a region of interest with respect to at least one of the images.

6. The method of claim 5, and further comprising generating a before-placement standard search image based on the region of interest.

7. The method of claim 6, and further comprising generating a before-placement test search image based on the region of interest.

8. The method of claim 7, wherein calculating a first offset between the before-placement standard image and the before-placement test image includes correlating the before-placement standard search image to the before-placement test search image.

9. The method of claim 1, wherein calculating a first offset between the before-placement standard image and the before-placement test image includes identifying at least one fixed reference on the subsequent workpiece.

10. The method of claim 9, wherein the fixed reference includes an electrical trace.

11. The method of claim 9, wherein the fixed reference includes a land.

12. The method of claim 9, wherein the fixed reference includes solder paste.

13. The method of claim 9, wherein the fixed reference includes artwork on the workpiece.

14. The method of claim 9, wherein the fixed reference includes a via.

15. The method of claim 1, wherein creating the standard difference image includes correlating the before-placement standard image and the after-placement standard image to generate an offset vector that is used to transform the after-placement standard image to an after-placement registered standard image.

16. The method of claim 1, wherein creating the test difference image includes correlating the before-placement test image and the after-placement test image to generate an offset vector that is used to transform the after-placement test image to an after-placement registered test image.

17. The method of claim 1 wherein the subsequent component is of the same type as the standard component and the subsequent component is placed upon the subsequent workpiece in the same orientation as the standard component is placed upon the standard workpiece.

18. The method of claim 1 wherein the registration offset represents a difference between the placement of the subsequent component upon the subsequent workpiece and the placement of the standard component upon the standard workpiece.

19. The method of claim 1 wherein the before-placement standard image, the after-placement standard image, the before-placement test image, and the after-placement test image, each includes at least one common background feature.

20. The method of claim 19 wherein the background feature is a workpiece feature.

* * * * *